US012609141B2

(12) United States Patent
Bekerman et al.

(10) Patent No.: US 12,609,141 B2
(45) Date of Patent: Apr. 21, 2026

(54) ADJUSTABLE CLOCK AND POWER GATING CONTROL

(71) Applicant: Apple Inc., Cupertino, CA (US)

(72) Inventors: Michael Bekerman, Los Gatos, CA (US); Matthew R. Johnson, Belmont, CA (US); Lior Zimet, Kerem Maharal (IL); Rohit K. Gupta, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 21 days.

(21) Appl. No.: 18/759,357

(22) Filed: Jun. 28, 2024

(65) Prior Publication Data

US 2025/0104742 A1     Mar. 27, 2025

Related U.S. Application Data

(60) Provisional application No. 63/585,305, filed on Sep. 26, 2023.

(51) Int. Cl.
*G11C 5/14*          (2006.01)
*G06F 1/08*          (2006.01)

(52) U.S. Cl.
CPC . *G11C 5/14* (2013.01); *G06F 1/08* (2013.01)

(58) Field of Classification Search
CPC .... G11C 5/14; G11C 5/04; G06F 1/08; G06F 1/3225; G06F 1/324; G06F 1/3275
See application file for complete search history.

(56) References Cited

U.S. PATENT DOCUMENTS

| | | | |
|---|---|---|---|
| 2006/0156043 A1* | 7/2006 | Liu ........................ | G06F 1/3287 |
| | | | 713/300 |
| 2012/0102344 A1 | 4/2012 | Koeev et al. | |
| 2012/0151235 A1 | 6/2012 | Nasrullah et al. | |
| 2014/0208135 A1 | 7/2014 | Keil et al. | |
| 2018/0284874 A1* | 10/2018 | Sundararajan ........ | G06F 1/3275 |
| 2019/0079573 A1 | 3/2019 | Hanson et al. | |
| 2019/0214989 A1 | 7/2019 | Shon et al. | |
| 2019/0311748 A1 | 10/2019 | Rohleder et al. | |

* cited by examiner

*Primary Examiner* — Xiaochun L Chen
(74) *Attorney, Agent, or Firm* — Kowert, Hood, Munyon, Rankin & Goetzel, P.C.; Dean M. Munyon

(57) ABSTRACT

Adjustable clock and power gating control is facilitated hereby. In aspects, a power management circuit is coupled to a memory controller circuit that is coupled to a memory resource circuit and to a plurality of heterogeneous client circuits configured to access the memory resource circuit via the memory controller circuit. The power management circuit is configured to receive operating parameters associated with the plurality of client circuits and to determine, based on the operating parameters, a threshold power state for the memory resource circuit. Additionally, the power management circuit is configured to initiate a clock gating operation, a power gating operation, or both for the memory resource circuit and to maintain at least the threshold power state for the memory resource circuit by limiting performance of the clock gating operation, the power gating operation, or both for the memory resource circuit. Other aspects and features are also claimed and described.

20 Claims, 9 Drawing Sheets

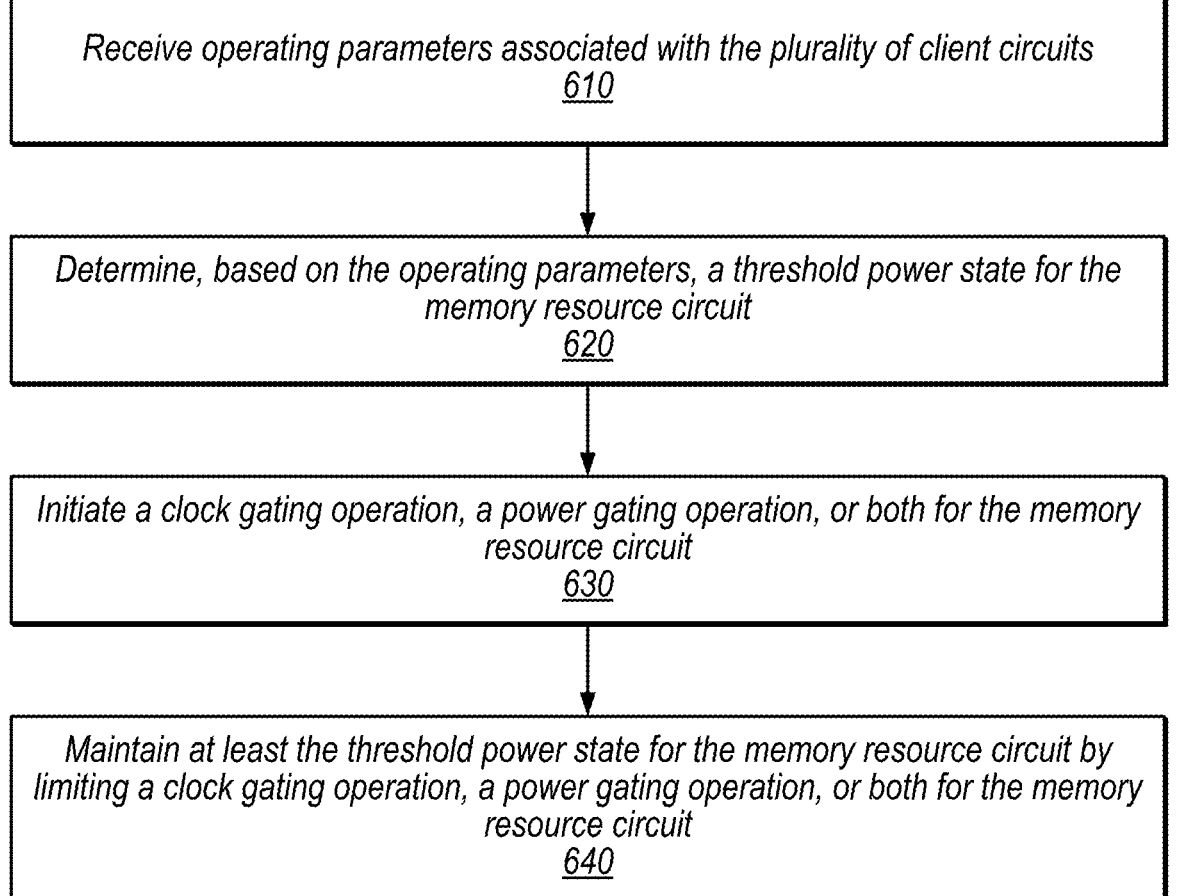

Receive operating parameters associated with the plurality of client circuits
610

Determine, based on the operating parameters, a threshold power state for the memory resource circuit
620

Initiate a clock gating operation, a power gating operation, or both for the memory resource circuit
630

Maintain at least the threshold power state for the memory resource circuit by limiting a clock gating operation, a power gating operation, or both for the memory resource circuit
640

FIG.6

ADJUSTABLE CLOCK AND POWER GATING CONTROL

CROSS REFERENCE TO RELATED APPLICATIONS

The present application claims priority to U.S. Provisional App. No. 63/585,305, entitled "Memory Clock and Power Gating Control," filed Sep. 26, 2023, the disclosure of which is incorporated by reference herein in its entirety.

BACKGROUND

Technical Field

This disclosure relates generally to computer architecture and more particularly to gating techniques for memory resource circuitry that is accessible to components of a system-on-a-chip (SOC).

Description of Related Art

Modern electronic devices often include one or more SOCs. A given SOC typically includes a plurality of memory request generators or heterogeneous client circuits that may request access to a memory resource circuit of the device. The memory request generators may include a compute complex, a graphics unit, media processing units, a display unit, an input/output (I/O) bridge, a first fabric, or combinations of these. An example memory resource circuit may include all or portions of a memory cache controller (MCC), a memory cache, a dynamic random access memory (DRAM) channel control circuit (DCS), or combinations of these. A given memory request generator may request access to the memory resource circuit via a memory controller or memory cache.

Clock and power gating (CPG) is used extensively in SOCs to reduce power consumption when various components are idle. For memory systems, it may be difficult to use CPG because of the latency for in-flight requests to reach the memory system and the burstiness of memory traffic from some sources (e.g., CPUs). Additionally, a memory controller may enter CPG, with the result that arriving requests may cause a wakeup and added latency thereby reducing performance and consuming power in performing the wakeup. The resulting lost performance may, in turn, cause other components to enter CPG, exacerbating this effect.

In more recent SOCs with multiple memory controllers independently controlling separate DRAM chips, these problems may be even worse because requests may first be transmitted to one memory controller, allowing other memory controllers to enter CPG just before requests start arriving for those memory controllers. To combat this, long hysteresis cycles have been implemented before allowing CPG, which may be inefficient in terms of power consumption.

BRIEF DESCRIPTION OF DRAWINGS

FIG. 6 is a flow diagram illustrating example operations to implement dynamically adjustable CPG control, according to some embodiments.

DETAILED DESCRIPTION

Figure 1:
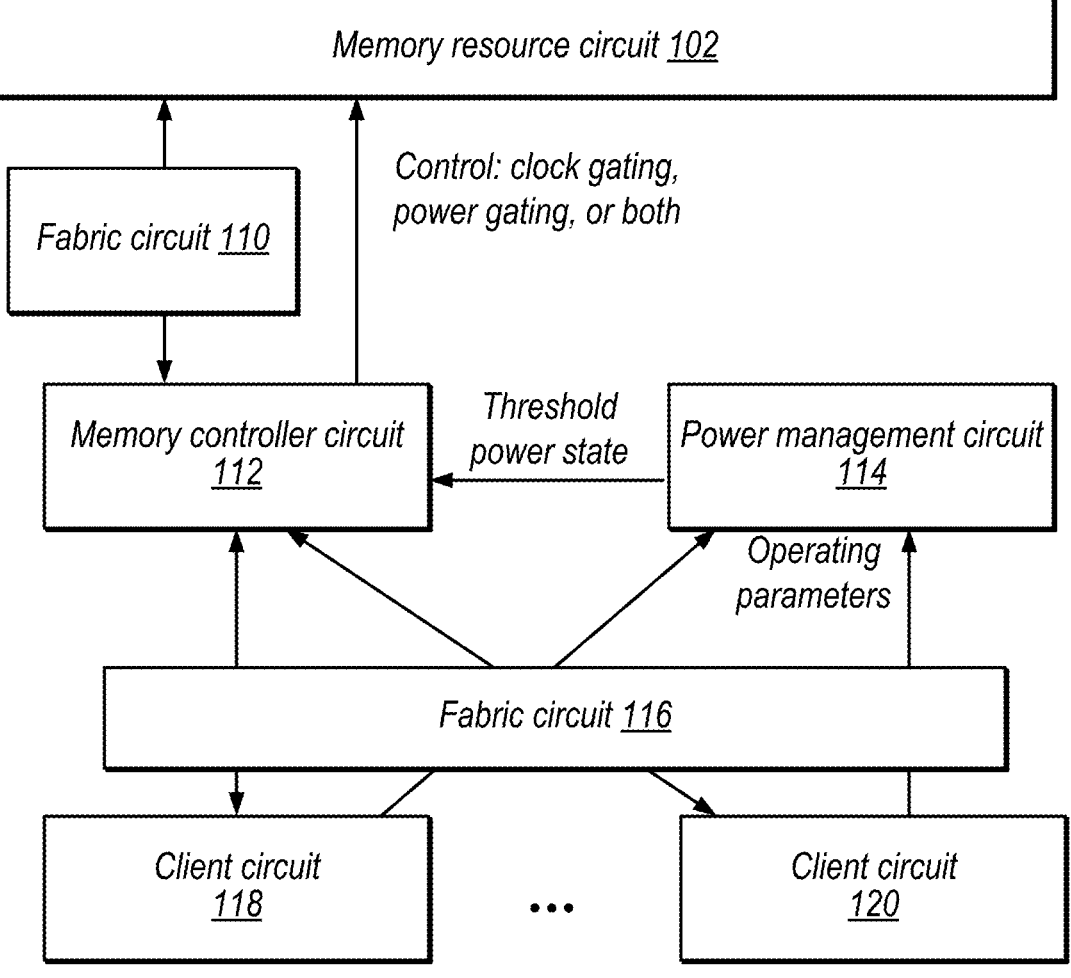
FIG. 1 is a block diagram illustrating an example of CPG control based on client-circuit operating parameters, according to some embodiments.

In disclosed embodiments, detailed information from memory request generators and adjustable CPG decisions based on this information may facilitate efficient CPG operations. These operations may reduce power consumption while reducing impacts on device performance relative to traditional CPG techniques.

Memory controllers of SOCs typically employ CPG operations to reduce power consumed by a memory resource circuit in response to detecting that memory request generators are in inactive states. However, extensive use of CPG operations may introduce problems. One problem may include decreased SOC operational performance due to increased memory latency. For example, when the memory request generators transition from inactive states to active states and request access to the memory resource circuit via the memory controller, the memory controller may send a wake-up signal (WUS) to the memory resource circuit. However, a quantity of time elapses from a first instance of time at which the WUS is sent to the memory resource circuit and a second instance of time at which the memory resource circuit processes the memory access request. This memory latency may impinge upon an operational performance of a memory request generator, the SOC itself, the electronic device, or a combination thereof.

Another problem may include a possibly long delay before a CPG operation is implemented. To illustrate, modern SOCs may include multiple memory controllers, each of which is configured to control access to a memory resource circuit of the electronic device. In these modern SOCs, a memory resource circuit accesses requests generated by memory request generators may be routed to a first set of memory controller(s). Accordingly, a second set of memory controller(s) and their associated memory resource circuit may perform CPG operations. To accommodate these CPG operations, long hysteresis cycles may be implemented before initiating CPG, thereby introducing further operational inefficiencies.

Additionally, components of the SOC may experience latency when waiting for a link to be configured before beginning to communicate via a fabric. In some cases, this latency impinges on the performance of the component and on the SOC generally. Accordingly, link teardown, in which the link is disabled, may, in some circumstances, negatively affect SOC performance.

Further, in some circumstances, to conserve power, a power level of clock circuitry of the SOC (e.g., PLLs) may be reduced. This may also reduce power consumption but increase latency when resuming operations.

Adjustable CPG techniques disclosed herein may reduce or solve the problems discussed above. In these embodiments, CPG operations are controlled based on data that indicates various operating parameters associated with memory request generators. For example, a power management circuit may receive operating parameters associated with the memory request generators. The power management circuit may determine, based on the operating parameters, a threshold power state for the memory resource circuit. A power management circuit coupled to the memory resource circuit may maintain at least the threshold power state for the memory resource circuit. For instance, to maintain the threshold power state, the power management circuit may be configured to limit performance of CPG operations for the memory resource circuit. The CPG operations may additionally include a link teardown operation, which may be disabled based on the received operating parameters.

The operating parameters may indicate characteristics associated with the memory request generators. Example operating parameters include, without limitation: information associated with outstanding transactions, workload classification information, floor request information, and fabric link information.

In some embodiments, a disclosed interface allows various memory request generators (e.g., CPU, GPU, various peripheral components, etc.) to generate one of multiple levels of "keep alive" for the memory system. The lowest level may correspond to no specific request, which is the default, and allows for any desired power and clock gating in the memory system components. Other levels may be based on whether the given memory request generator is performing a "performance-biased" workload or a "power-biased workload," as well as characteristics of outstanding transactions (e.g., whether or not the memory request generator has any outstanding transactions) sent to the memory controller.

Generally, a performance-biased workload is more demanding and will suffer more if memory latency increases; thus, decisions between performance and power conservation should favor performance for performance-biased workloads. Similarly, a power-biased workload is less demanding and can absorb a certain amount of increased memory latency; therefore, decisions between performance and power conservation should favor power conservation for power-biased workloads. Requesting clients/agents may characterize their workloads using various techniques and report their type of workload as described herein.

In some embodiments, at least some clients/agents may connect to a bridge (e.g., between communications fabrics), which may be configured to generate KeepAlive signals based on inputs from one or more requesters. In bridge scenarios, signaling from multiple enabled requesters may be logically ORed to generate signaling indicating outstanding transactions, perf/power biases, and floor enablement, for example. Other clients/agents may be configured to provide their own custom KeepAlive signals and may not use a bridge.

In some embodiments, a central controller in power management circuitry (PMGR) receives all the inputs and determines whether various memory system components and the fabric between requestors and the memory system can clock and power gate, then transmits those controls to the components to ensure that the stay at the desired threshold power state. For example, the levels may include awake (no clock gate, no power gate), allow clock gate-no power gate, and allow both clock and power gating. The PMGR may also control power decisions based on software-controlled registers.

In some embodiments, link teardown enablement for the communication fabric is also specified by PMGR along with whether or not parallel DCS wakeup is allowed. Parallel DCS wakeup may be used when a given DCS is awakened from clock or power gating due to a request being delivered to the given DCS, to cause the other DCS circuits to also wakeup. This may be useful when memory access patterns jump around the memory space quickly, such as in pointer chasing. In some embodiments, PMGR may similarly control whether or not the DRAM self-refresh and power down modes can be entered. In example multi-die implementations, the PMGR on each chip may consolidate keep alive information on its chip and transmit it to the other PMGR to establish a consistent state across the dies.

Disclosed techniques may advantageously reduce power consumption by enabling CPG operations in distributed, complex systems, while reducing or avoiding performance degradations associated with traditional CPG techniques. Specifically, the operating parameters provided by memory request generators and dynamically adjustable CPG decisions based on the provided operating parameters may facilitate these improvements.

FIG. 1 is a block diagram illustrating an example of CPG control based on client-circuit operating parameters, according to some embodiments. As depicted in FIG. 1, an electronic device, such as an SOC, includes memory resource circuit 102, fabric circuit 110, memory controller circuit 112, power management circuit 114, fabric circuit 116, and a plurality of client circuits 118-120 (which may be referred to as memory request generators).

Memory controller circuit 112 is coupled to memory resource circuit 102 via fabric circuit 110 and additionally is coupled to the plurality of client circuits 118-120 via fabric circuit 116. Additionally, memory controller circuit 112 is coupled to power management circuit 114. Memory resource circuit 102 may include or correspond to cache circuitry, dynamic random access memory channel control circuitry, or combinations thereof.

During operation, one or more of client circuits 118-120 provides one or more operating parameters, associated with the one or more of client circuits 118-120, to power management circuit 114. For example, client circuit 118 may provide a first set of one or more operating parameters associated with or corresponding to client circuit 118 to power management circuit 114. As another example, client circuit 120 may provide a second set of one or more operating parameters associated with or corresponding to client circuit 120 to power management circuit 114. At least one operating parameter of the second set of one or more operating parameters may have a value that is distinct from a value of at least one operating parameter of the first set of one or more operating parameters.

Based on the provided one or more operating parameters, power management circuit 114 determines one or more threshold power states for memory resource circuit 102. The one or more threshold power states correspond to one of multiple power states at which power management circuit 114 is configured to operate memory resource circuit 102. In some embodiments, when power management circuit 114 operates memory resource circuit 102 at the determined threshold power state, operations of the corresponding client circuit 118 or 120 may be minimally affected while memory resource circuit 102 operates at the threshold power state. To illustrate, based on first operating parameters provided to power management circuit 114 by client circuit 118, power management circuit 114 may determine a first threshold power state. Based on second operating parameters provided to power management circuit 114 by client circuit 120, power management circuit 114 may determine a second threshold power state that may be distinct from the first threshold power state.

Power management circuit 114 may select, from among the one or more threshold power states, the threshold power state that has the least effect on the operation of any one of client circuit 118, 120 while memory resource circuit 102 operates at the selected threshold power state. For example, if a first threshold power state would impinge upon operation of client circuit 118 but not on operation of client circuit 120, while a second threshold power state would impinge on operation of neither client circuit 118 nor client circuit 120, power management circuit 114 may be configured to select the second threshold power state at which to operate memory resource circuit 102. The selected power state may therefore be referred to as a "most awake" state from among multiple threshold power states associated with client circuit operating parameters.

Power management circuit 114 is configured to maintain at least the selected threshold power state for memory resource circuit 102. To maintain the at least the threshold power state, power management circuit 114 is configured to limit performance of one or more CPG operations for memory resource circuit 102. In general, power management circuit 114 is configured to provide an indicator corresponding to the selected "most awake" state to memory controller circuit 112, which is configured to control memory resource circuit 102 in accordance with the provided indicator by performing or limiting the corresponding clock gating operation(s), power gating operation(s), or both on memory resource circuit 102. For example, if power management circuit 114 selected the second threshold power state and if the second threshold power state corresponds to performance of a clock gating operation but not a power gating operation, power management circuit 114 may be configured to provide an indicator corresponding to the second threshold power state to memory controller circuit 112, which may be configured to perform a clock gating operation on memory resource circuit 102 but not a power gating operation on memory resource circuit 102 in accordance with the provided indicator.

The disclosed adjustable CPG control may advantageously reduce power consumed by memory resource circuit 102 while reducing operational inefficiencies associated with conventional CPG control techniques. To illustrate, by selecting the threshold power state that is a most active power state from among a plurality of threshold power states corresponding to one or more client circuits of plurality of client circuits 118-120, operations of client circuits 118, 120 are minimally affected while power management circuit 114 operates (e.g., indirectly via memory controller circuit 112) memory resource circuit 102 at the selected threshold power state. In particular, power management circuit 114 is configured to generate a threshold power state indication for one or more client circuits 118-120 of a plurality of client circuits based on operating parameters provided to power management circuit 114 by one or more client circuits 118-120. In this manner, the threshold power states corresponding to the one or more client circuits 118-120 are specific to each of the one or more client circuits 118-120 and to memory resource circuit 102 on which the CPG operation is being performed. Thus, power management circuit 114 is configured to select the threshold power state at which to operate the memory resource circuit 102 based on operating parameters provided by the one or more client circuits 118-120. Accordingly, the disclosed adjustable CPG control may advantageously provide tunable CPG operations configured to reduce impact to operational efficiency while reducing power consumption.

While FIG. 1 depicts that memory resource circuit 102 is coupled to memory controller circuit 112 via fabric circuit 110, in some embodiments, memory resource circuit 102 is directly coupled to memory controller circuit 112. Additionally, while FIG. 1 depicts that memory controller circuit 112 is coupled to client circuit 118 via fabric circuit 116, in other embodiments, memory controller circuit 112 is directly coupled to client circuit 118. Further, it is understood that the plurality of client circuits 118-120 may include a multiplicity of client circuits in addition to client circuit 118 and client circuit 120. Moreover, while memory resource circuit 102 is shown, a plurality of memory resource circuits may be present and may be controllable by power management circuit 114.

Figure 2:
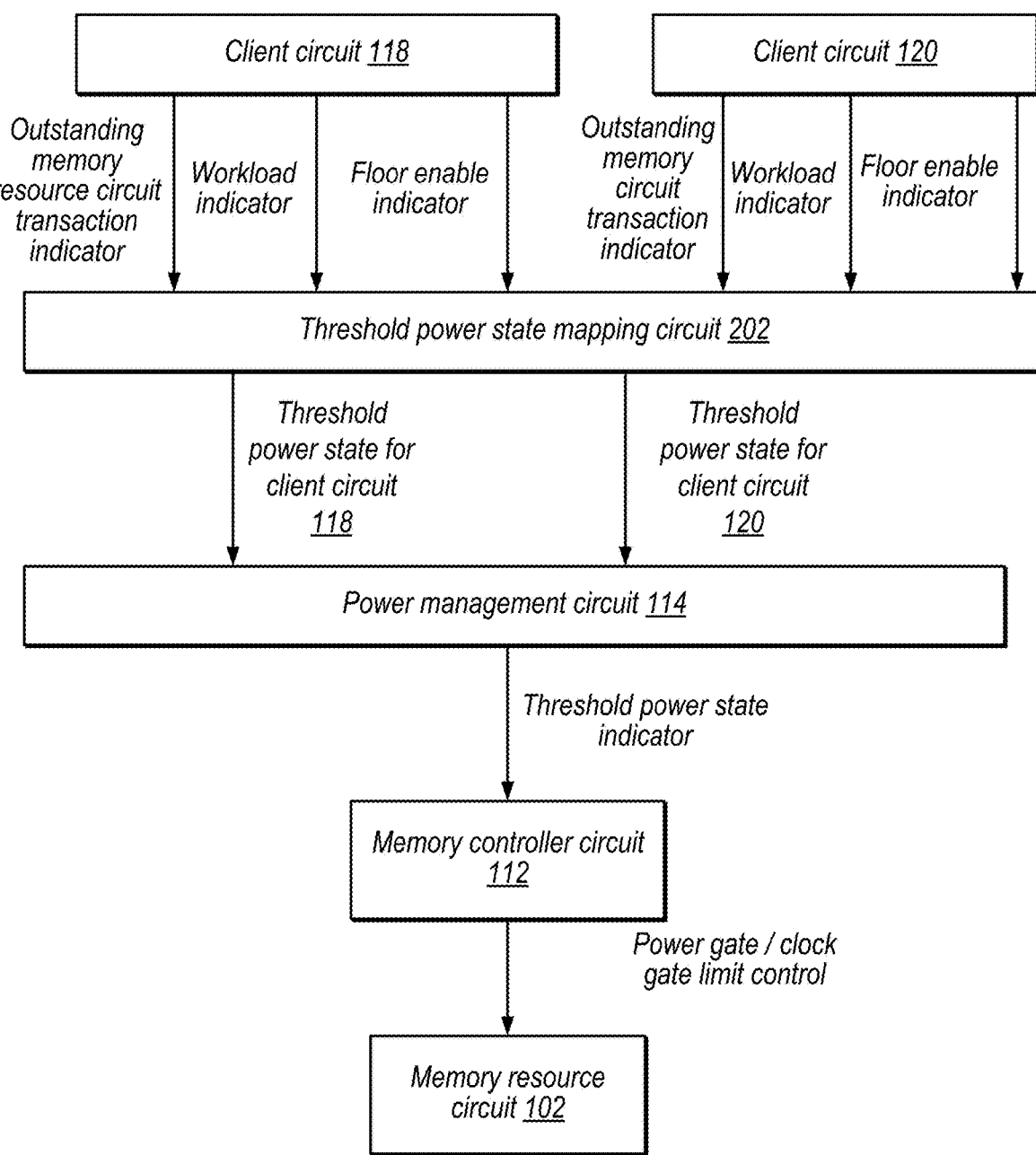
FIG. 2 a block diagram illustrating an example of multi-level adjustable CPG control of a memory circuit, according to some embodiments.

FIG. 2 is a block diagram illustrating an example of multi-level adjustable CPG control of a memory resource circuit, according to some embodiments. In the illustrated example, the device first maps operating parameters from client circuits to threshold power states and then determines limits on CPG operations based on those thresholds.

In the illustrated example, a given client circuit provides the following operating parameters to threshold power state mapping circuit 202: an outstanding memory resousrce circuit transaction indicator, a workload indicator, and a floor enable indicator. These parameters are included for purposes of illustration but are not intended to limit the scope of the present disclosure. For example, other parameters may be included, illustrated parameters may be omitted, etc. in various embodiments. Further, different client circuits may provide different combinations of operating parameters, in some embodiments, which may or may not overlap or coincide with one another.

In some embodiments, the outstanding memory resource circuit transaction indicator indicates a count of requests to memory circuit 102 that have been generated by client circuit 118 but that are not complete. The workload indicator indicates a workload category of a workload processed by client circuit 118, such as whether the workload is a performance-biased workload, susceptible to memory latency, or a power-biased workload, that is less susceptible to memory latency than a performance-biased workload. For example, the performance-biased workload may include or correspond to a workload, the processing of which, by client circuit 118, may be impinged upon by a CPG operation performed on memory resource circuit 102 by power management circuit 114. Conversely, the power-biased workload may include or correspond to a workload, the processing of which, by client circuit 118, may not be impinged upon by the CPG operation. The floor enable indicator indicates a request, by client circuit 118, to maintain memory resource circuit 102 at a particular threshold power state.

Based on receipt of sets of one or more operating parameters, threshold power state mapping circuit 202, in some embodiments, is configured to generate threshold power states that correspond to or are associated with each client circuit that provided the corresponding set of the one or more operating parameters. For example, threshold power state mapping circuit 202 may be configured to generate, based on the first set of one or more operating parameters provided by client circuit 118, a threshold power state for client circuit 118. Similarly, threshold power state mapping circuit 202 may be configured to generate, based on the second set of one or more operating parameters provided by client circuit 120, a threshold power state for client circuit 120. The threshold power state corresponding to client circuit 118 may be different from or the same as the threshold power state corresponding to client circuit 120. As discussed below with reference to FIG. 3, the threshold power state mapping may be configurable on a per-client circuit basis and on a per memory circuit basis (or per other type of resource) such that an identical set of operating parameter values for two different clients and for two different memory circuits may map to different threshold power states.

Power management circuit 114 may be configured to provide a threshold power state indicator to memory controller circuit 112. The threshold power state indicator indicates a most active threshold power state from among the threshold power states received, by power management circuit 114, from threshold power state mapping circuit 202. Memory controller circuit 112 may be configured limit/perform CPG operations on memory resource circuit 102 based on the threshold power state indicator. The threshold power state may be specified at high granularity, e.g., per memory resource.

FIG. 2 depicts client circuits 118, 120, threshold power state mapping circuit 202, power management circuit 114, memory controller circuit 112, and memory resource circuit 102. While two client circuits 118, 120 are depicted, a multiplicity of client circuits may be present. During operation, client circuit 118 may be configured to provide a first set of one or more operating parameters to threshold power state mapping circuit 202. Additionally, client circuit 120 may be configured to provide a second set of one or more operating parameters to threshold state mapping circuit 202. Other client circuits (not depicted) may be configured to provide sets of one or more operating parameters to threshold state mapping circuit 202 that correspond to or are associated with these other client circuits.

Figure 3:
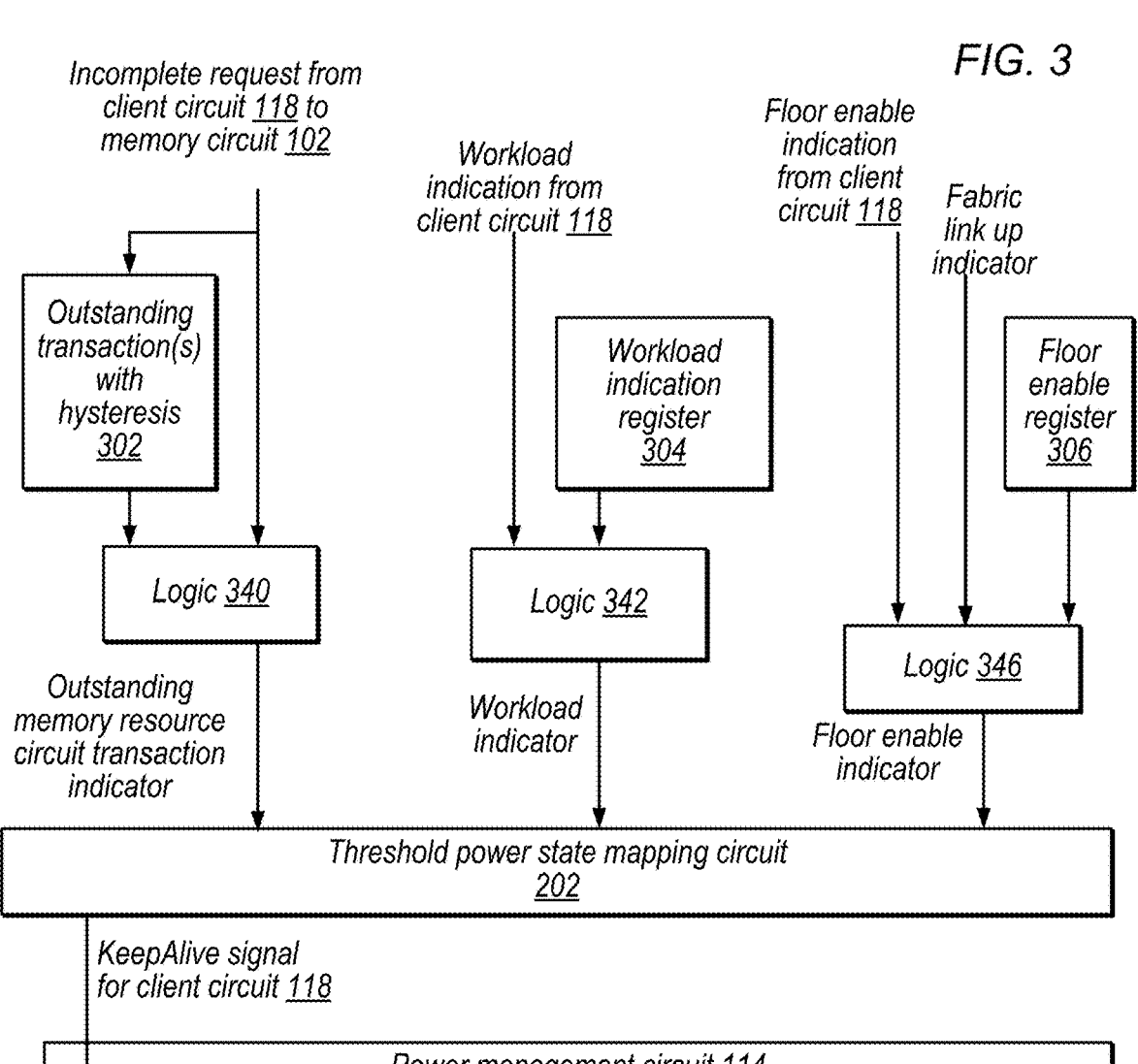
FIG. 3 a block diagram illustrating a detailed example implementation of adjustable CPG control, according to some embodiments.

FIG. 3 is a block diagram illustrating a detailed example implementation of adjustable CPG control, according to some embodiments. Circuitry depicted in FIG. 3 is configured to receive one or more operating parameters from one or more client circuits and, based on the received one or more operating parameters, the depicted circuitry is further configured to limit a CPG operation performed on one or more target circuits, such as a memory circuit, in accordance with a threshold power state selected by the described circuitry. As shown, the power management circuit 114 may also generate self-refresh control signals and parallel channel controller wakeup control signals.

FIG. 3 depicts logic 340-346, threshold power state mapping circuit 202, and power management circuit 114. Additionally, FIG. 3 depicts workload indication register 304 and floor enable register 306.

Logic 340-346, in some embodiments, are configured to generate the one or more operating parameters associated with a client circuit, such as that may correspond to client circuit 118 or client circuit 120. In some embodiments, logic 340-346 may correspond to OR gates; however, logic 340-346 generally may correspond to any circuitry capable of combining a plurality of logical inputs to generate a logical output. Threshold power state mapping circuit 202 may be configured to receive, for a client circuit, such as client circuit 118, the input operating parameters and may be configured, based on the one or more received operating parameters, to generate a KeepAlive signal indicating a threshold power state corresponding to the client circuit, such as client circuit 118. For example, client circuit 118 may correspond to a graphics processing unit (GPU) and the KeepAlive signal may indicate a threshold power state of the GPU. Power management circuit 114 may receive one or more KeepAlive signals associated with or corresponding to one or more client circuits of the plurality of client circuits. Based on a set of CPG actions associated with respective client KeepAlive signals, power management circuit 114 may be configured to select a threshold power state at which to operate one or more target resources, such as memory resource circuit 102, so as to minimally impact the operations of the plurality of client circuits while the one or more target resources are operated at the corresponding threshold power state. In addition to memory resource circuit 102, the one or more target resources may include a fabric network interface, one or more internal fabric circuit resources, all or portions of a memory cache controller, DCS circuitry, links between specific communicator circuits, etc.

Various inputs to any instance of logic 340, 342, or 346 may be enabled or disabled for a given client (e.g., using an AND gate that takes, as inputs, the input and an enable signal). Further, control registers (e.g., 304 and 306) may be used for clients that are not configured to report their own operating parameters, to give other circuitry the ability to provide input in parallel for clients that are configured to report their own operating parameters, etc.

Details of operation of the circuitry are described with reference to client circuit 118, but operations corresponding to client circuit 120 and other client circuits may be identical to those described with reference to client circuit 118. In particular, logic 340 may be configured to set the outstanding memory resource circuit transaction indicator if either of its inputs are set. The outstanding memory resource circuit transaction indicator generated by logic 340 indicates a count of requests to memory resource circuit 102 that have been generated by client circuit 118 and that are not complete. In other embodiments, this indicator may be encoded in other ways, e.g., as a binary indicator of whether there are any outstanding transactions. Some client circuits, such as client circuit 118, are configured to indicate, via an incomplete request indictor, that such client circuits are actively accessing memory resource circuit 102. For example, client circuit 118 generates an incomplete request indicator to indicate that client circuit 118 actively accesses memory resource circuit 102 (e.g., when it has one or more initiated requests that have not completed). In contrast, other client circuits may not be configured to provide an indicator of whether they have any incomplete requests. Accordingly, for such client circuits that do not provide an incomplete request indicator, a fabric circuit, such as fabric circuits 110, 116, that is coupled to such a client circuit is configured to generate an outstanding transaction indicator with hysteresis 302 to indicate whether the associated client circuit is actively accessing memory resource circuit 102.

Logic 342 may be configured to set the workload indicator if either of its workload indication inputs are set, e.g., from client circuit 118 or from workload indication register 304. The workload indicator indicates a workload category of a workload processed by client circuit 118 such as whether the workload category is performance-biased or power-biased. To elaborate, a workload indication from client circuit 118 received at logic 342 may indicate characteristics of a workload processed by client circuit 118. For example, the workload indication from client circuit 118 may indicate a workload that is performance-biased. Accordingly, the processing of a performance-biased workload by client circuit 118 may be more likely to be affected by a CPG operation performed on memory resource circuit 102. Alternatively, the workload indication from client circuit 118 may indicate a workload that is power-biased. A power-biased workload may not be negatively affected by a given CPG operation performed on memory resource circuit 102.

Additionally or alternatively, logic 342 may receive an input from workload indicator register 304. Workload indication register 304 may be a register that stores data indicating a workload type processed by each client circuit of a plurality of client circuits. For instance, workload indication register 304 may store data indicating a workload type processed by client circuit 118. As another example, workload indication register 304 may store data indicating a workload type processed by client circuit 120. Based on input received from workload indication register 304, logic 342 may be configured to generate workload indicator indicting a workload type associated with client circuit 118. In this manner, power management circuit 114 is configured to map the first set of operating parameters of the first client circuit, such as client circuit 118, to the first client threshold power state based on one or more configurable registers, such as workload indication register 304.

Logic 346 may be configured to generate floor enable indicator based on a floor enable indication from a client circuit, a fabric link up indicator, a floor enable register, or any combination thereof. Some client circuits, such as client circuit 118, may be configured to generate a floor enable indication to indicate a request, by such client circuits, to maintain one or more target circuits, such as memory circuit 102, at a particular threshold power state. However, other client circuits may be unable to generate the floor enable indication. For such circuits, a fabric link up indicator indicates whether internal fabric circuitry of the client circuit is active. If the fabric link up indicator indicates that the client circuit's internal fabric is active, then logic 346 is configured to generate, based on the fabric link up indicator, the floor enable indicator. Selector 346 may receive an indicator from floor enable register 306. Floor enable register 306 may store, for one or more client circuits of the plurality of client circuits, an indication to maintain memory circuit 102 at a particular threshold power state.

Threshold power state mapping circuit 202 may receive one or more operating parameters generated by logic 340, 342, and 346, or by combinations thereof and may be configured to generate a KeepAlive signal corresponding to a client circuit of the plurality of client circuits. The KeepAlive signal may indicate a threshold power state of the one or more target resources, such as memory circuit 102, such that, if the one or more target resources are maintained at the indicated power state, operations of the client circuit will not be negatively affected while the one or more target resources are operated at the indicated power state. For instance, threshold power state mapping circuit 202 may receive outstanding memory resource indicator, workload indicator, floor enable indicator, or any combination thereof as generated by logic 340-346, or any combination thereof and that corresponds to client circuit 118. Based on any one of the foregoing operating parameters, threshold power state mapping circuit 202 may be configured to generate a KeepAlive signal corresponding to client circuit 118 and may be further configured to provide the KeepAlive signal to power management circuit 114. The KeepAlive signal may be a multi-bit control signal that indicates a KeepAlive level of multiple levels supported for a given client circuit.

Power management circuit 114 may include a plurality of components configured to receive one or more KeepAlive signals generated for one or more client circuits of the plurality of client circuits. For example, a first component associated with multiplexer 352 may be configured to receive a KeepAlive signal generated for client circuit 118, while a second component associated with multiplexer 354 may be configured to receive a KeepAlive signal generated for client circuit 120. While FIG. 3 depicts multiplexers 352, 354, any selection logic may be used.

Based on KeepAlive signal received from threshold power state mapping circuit 202, multiplexer 352 may be configured to select one set of CPG actions from among sets 308A-308N for client circuit 118. A given set of CPG actions (e.g., 308A) may specify respective power threshold states associated with the multiple different target resources for which CPG actions are to be controlled. A given set of CPG actions may indicate whether one or more CPG actions should be disabled for each of the target resources (note that the resources discussed herein are included for purposes of explanation, but additional resources are contemplated, disclosed resources may be omitted, other combinations may be implemented, etc.).

For example, client circuit 118 may correspond to a GPU, and its KeepAlive signal may select CPG actions 308N that specify that one or more CPG actions for DCS circuitry and a fabric network interface are permitted, but that fabric link teardown for a link should be disabled. In a second example, client circuit 120 may be a display unit, and its KeepAlive signal may select CPG actions 310A, which may specify that one or more CPG actions for DCS circuitry are permitted but that CPG actions for the fabric network interface and link teardown for the link should be disabled. Based on these two sets of CPG actions 308N and 310A, threshold power state control circuit 362 may allow CPG actions for the DCS circuitry but not for the fabric network interface and may disable teardown of the link.

Threshold power state control circuit 362 may be configured to determine the "most awake" CPG action received from multiplexers corresponding to various client circuits (e.g., multiplexers 352 and 354). As discussed above, these actions may correspond to threshold power states. For example, the threshold power state that threshold power state control circuit 362 receives from multiplexer 352 may indicate a first threshold power state corresponding to operating memory resource circuit 102 at a first power level, such as indicating a clock gating operation but not a power gating operation. Additionally, the threshold power state indicator that threshold power state control circuit 362 receives from multiplexer 354 may indicate a second threshold power state corresponding to operating memory resource circuit 102 at a second power level lower than the first power level, such as a clock gating operation and a power gating operation. Threshold power state control circuit 362 may select the first threshold power state but not the second threshold power state, since the first threshold power state corresponds to a higher power state than the second threshold power state. Accordingly, in this example, threshold power state control circuit 362 may be configured to limit CPG to a clock gating but not a power gating operation performed on memory resource circuit 102.

Power management circuit 114 is further configured to, based on the operating parameters, determine whether to initiate a memory self-refresh interval, in the illustrated embodiment. For example, power management circuit 114 may determine to delay a self-refresh for all or a portion of a memory resource in response to determining that one or more clients would benefit from high memory performance (e.g., higher levels of KeepAlive signaling). Or, power management circuit 114 may determine to perform a self-refresh when relatively lower KeepAlive signaling is detected (because clients may suffer reduced impacts of the memory being unavailable during the self-refresh in this scenario).

Further, based on the operating parameters, power management circuit 114 is configured to determine whether to wake one or more other memory channel control circuits from a CPG operation in response to an incoming request to a first memory channel control circuit. For example, power management circuit 114 may be configured to wake one or more other memory channel control circuits associated with memory controller circuit 112 from a low-power state in response to an incoming request to a first memory channel control circuit. This may improve performance by waking channels that are likely to be used in the near future.

Additionally, power management circuit 114 may be configured to regulate a power level at which clock circuitry (e.g., a given phase-locked loop (PLL)) operates based on various signaling discussed herein. Generally, reducing a power level of clock circuitry may increase clock gating exit latency of the one or more heterogeneous circuits that operate based on the clock, while maintaining clock circuitry at a higher power level may increase power consumption. Therefore, power management circuit 114 may select from multiple power levels for a PLL circuit based on operating parameters of client circuit(s). For example, a CPG action 308 selected by multiplexer 352 may indicate a PLL power level as part of a threshold power state or power management circuit 114 may control PLL power level separately, e.g., based on a highest requested power level from among multiple heterogenous clients that receive clock signals from the PLL. In this manner, power management circuitry 114 may reduce PLL power levels to save power in certain scenarios, while maintaining higher PLL power levels to reduce exit latency and improve performance in other scenarios.

Further, power management circuit 114 may be configured to implement a link teardown disable operation to prevent link teardown in some instances. Fabric circuits 110, 116 of an SOC, network interfaces between fabric circuits 110, 116 and heterogeneous circuits, or combinations thereof may be configured to control links between various components, e.g., track state such as message acknowledgements, credit returns, etc. During link teardown, the one or more links may be deactivated through a synchronized process configured to ensure that data flows are not interrupted (e.g., that credits have been returned, acknowledgements have been received, etc.). Generally, a link should be torn down before clock gating or power gating of fabric components associated with the link occurs, otherwise communication state may be lost. Therefore, tearing down links may reduce the time needed to begin a CPG operation. However, while link teardown may be advantageous from a power conservation perspective, link teardown may be disadvantageous from a performance perspective. For example, components may experience latency when waiting for a link to be configured before beginning to communicate via the fabric. Accordingly, in some embodiments, power management circuit 114 may be configured to operate based on various signaling that indicates whether link teardown should be enabled. As one example, a client circuit may set the fabric link up indicator which may cause the floor enable indicator to be set, which may result in a certain KeepAlive signal level, which may select a GPC action 308 that disables link teardown. More generally, power management circuitry 114 may disable link teardown for various fabric components based on operating conditions for heterogeneous client circuits, e.g., based on various signaling associated with latency needs for client(s).

Note that various disclosed embodiments limit CPG actions by power management circuit 114. In these embodiments, power management circuit 114 may implement various techniques or algorithms to determine when to initiate CPG actions and the disclosed techniques may impose limits on those CPG actions (e.g., by determining a threshold power state for one or more memory resources, one or more fabric resources, or both). In some embodiments, power management circuit 114 may also trigger CPG actions based on various disclosed inputs, subject to disclosed limits. Power management circuit 114 may also trigger CPG actions based on other inputs not discussed herein.

Figure 4:
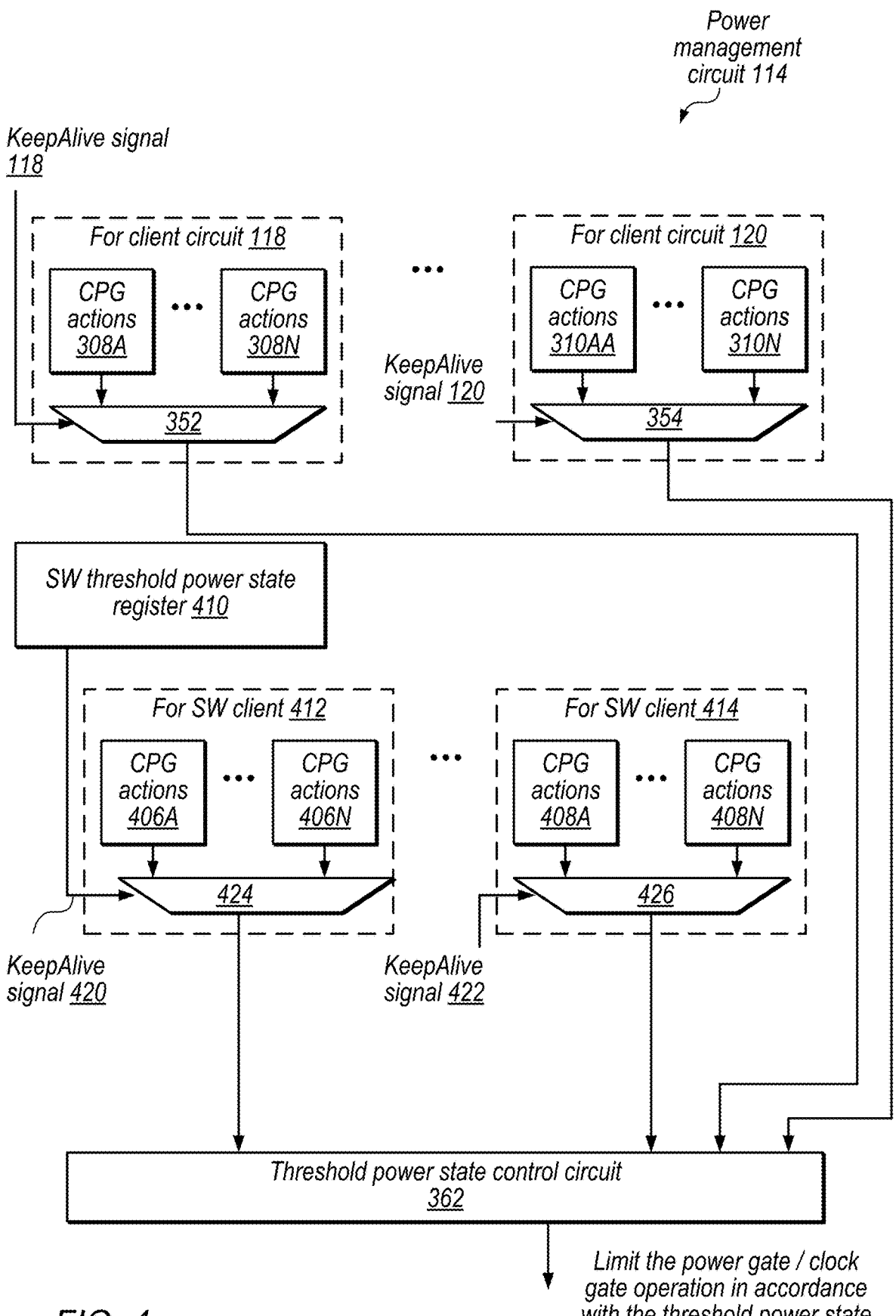
FIG. 4 is a block diagram illustrating an example of circuity configured to implement dynamically adjustable CPG control for one or more software (SW) clients, according to some embodiments.

FIG. 4 is a block diagram illustrating an example of circuity configured to implement adjustable CPG control for one or more software (SW) clients, according to some embodiments. The implementation of FIG. 4 may allow software (e.g., executing on a CPU, a firmware processor, or a client circuit) to request threshold power states in addition to or in place of hardware-generated requests. Note that some client circuits may not execute instructions but may be custom hardware. Also, a software resource may control disclosed registers for circuitry executing the software or for other hardware.

FIG. 4 depicts power management circuit 114 that includes a first component associated with client circuit 118 that includes multiplexer 352 and a second component associated with client circuit 120 that includes multiplexer 354. These elements may be configured as explained above with reference to FIG. 3. Additionally, FIG. 4 depicts SW threshold power state register 410, a third component associated with SW client 412, and a fourth component associated with SW client 414. The third component includes multiplexer 424, and the fourth component includes multiplexer 426. Further, power management circuit 114 includes threshold power state control circuit 362.

During operation, SW client 412 of a plurality of SW clients may indicate, to power management circuit 114, a threshold power state at which to operate a target resource, such as memory resource circuit 102, to reduce an impact on operations of the SW client 412 while memory resource circuit 102 is operated at the indicated threshold power state. For example, SW threshold power state register 410 may store threshold power state data associated with a plurality of SW clients, such as associated with SW clients 412, 414. In response to a request from SW client 412, SW threshold power state register 410 may provide KeepAlive signal 420 to multiplexer 424. KeepAlive signal 420 may include or indirectly indicate (e.g., in conjunction with CPG actions 406A-406N) a threshold power state at which the target resource may be operated to reduce an impact on operations of SW client 412. Similarly, in response to a request from SW client 414, SW threshold power state register 410 may provide KeepAlive signal 422 to multiplexer 426. KeepAlive signal 422 may include or correspond to a threshold power state at which the target resource may be operated to reduce an impact on operations of SW client 414. The threshold power state at which the target resource may be operated to reduce an impact on operations of SW client 412 may be distinct from the threshold power state at which the target resource may be operated to reduce an impact on operations of SW client 414.

In response to receipt of KeepAlive signal 420, multiplexer 424 may be configured to select first set of CPG actions from among plurality of CPG actions 406A-406N. The plurality of CPG actions 406A-406N may include or correspond to different threshold power states at which the target resource may be operated. Similarly, in response to receipt of KeepAlive signal 422, multiplexer 426 may be configured to select second set of CPG actions from among plurality of CPG actions 408A-408N. The second set of CPGs action may be distinct from the first set of CPG actions.

Threshold power state control circuit 362 may be configured to receive the selected first set of CPG actions and the selected second set of CPG actions. Threshold power state control circuit 362 may be configured to determine the threshold power state for the target resource as a most active power state from at least the first threshold power state corresponding to SW client 412 and the second client threshold power state corresponding to SW client 414. Accordingly, threshold power state control circuit 362 may be configured to perform the CPG operation on the target resource in accordance with the determined threshold power state that is the most active power state for the target resource (potentially from threshold power states associated with both hardware and software clients).

Figure 5:
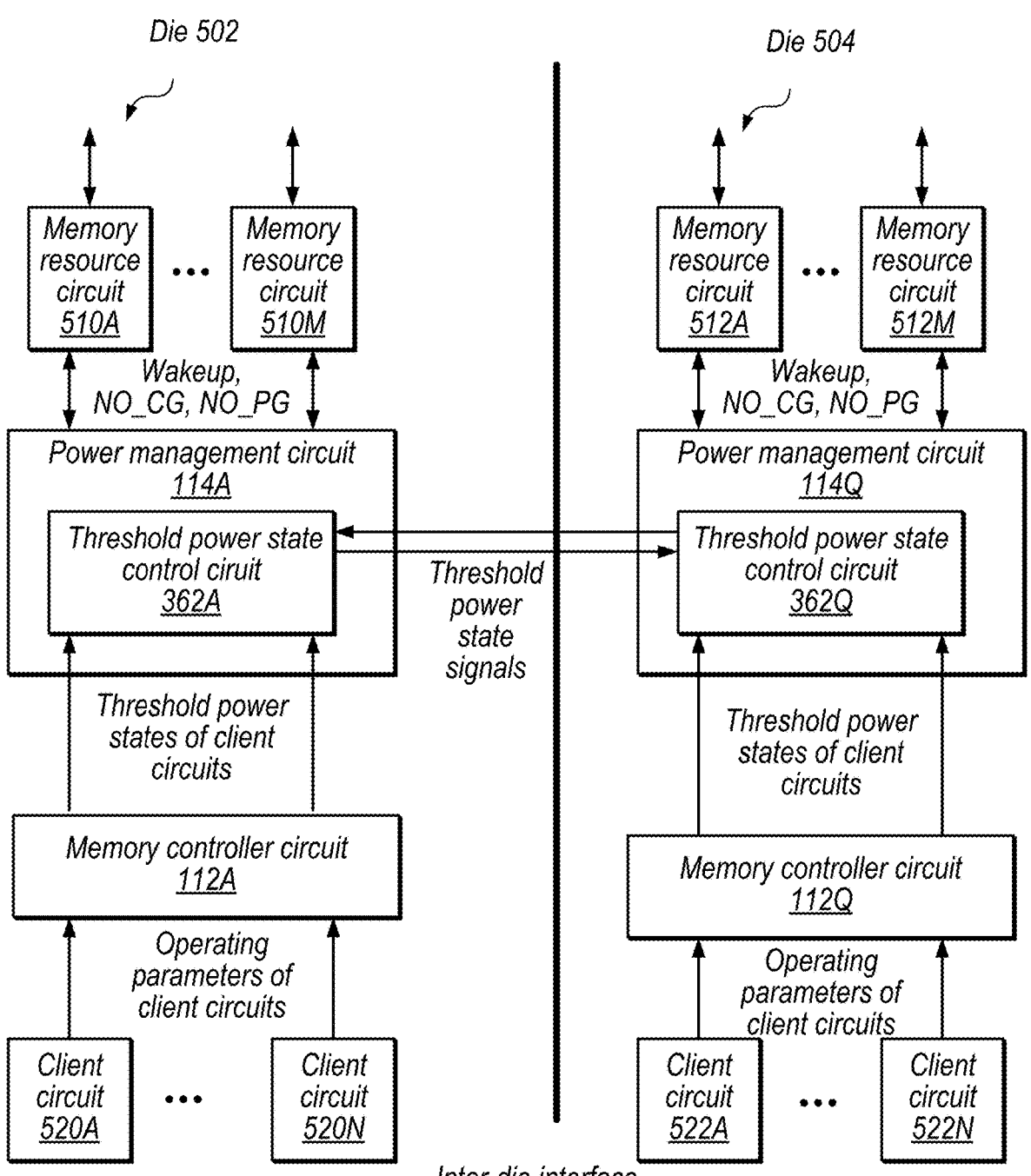
FIG. 5 is a block diagram illustrating an example of circuity configured to implement dynamically adjustable CPG control in a multi die configuration, according to some embodiments.

FIG. 5 is a block diagram illustrating an example of circuitry configured to implement adjustable CPG control in a multi die configuration, according to some embodiments. FIG. 5 depicts that a memory controller circuit and a power management circuit may be implemented on one or more copackaged integrated circuit dies. To illustrate, depicted in FIG. 5 are die 502 and die 504 communicatively coupled by an inter-die interface. Each of die 502, 504 include a plurality of memory resource circuits 510A-510M, 512A-512M, which may include or correspond to memory resource circuit 102. Additionally, each of die 502, 504 include power management circuit 114A, 114Q which may include or correspond to power management circuit 114. Further each of die 502, 504 include memory controller circuit 112A-112Q, which may include or correspond to memory controller circuit 112 and client circuits 520A-520N, 522A-522N, which may include or correspond to client circuits 118-120. Accordingly, in some embodiments, power management circuit 114Q and plurality of client circuits 522A-522N are included on a first substrate distinct from a second substrate on which power management circuit 114A and memory controller circuit 112A are included.

During operation, threshold power state control circuit 362A may receive a first threshold power state signal from threshold power state control circuit 362Q. The first threshold power state signal indicates a second threshold power state determined by threshold power state control circuit 362Q based on threshold power states associated with client circuits 522A-522N and received, by threshold power state control circuit 362Q, from memory controller circuit 112Q. For example, threshold power state control circuit 362Q may be configured to determine a second threshold power state based on threshold power states associated with client circuits 522A-522N and provided to threshold power state control circuit 362Q by memory controller circuit 112Q.

Similarly, threshold power state control circuit 362Q may receive a second threshold power state signal from threshold power state control circuit 362A. The second threshold power state signal indicates a first threshold power state determined by threshold power state control circuit 362A based on threshold power states associated with client circuits 520A-520N and received, by threshold power state control circuit 362, from memory controller circuit 112A. In some implementations, power management circuit 114A determines the first threshold power state based on the second threshold power state indicated by the first threshold power state signal. For example, prior to determining the first threshold power state signal based on threshold power states indicated by memory controller 112A, threshold power state control circuit 362A may also receive, as an input, the first threshold power state signal from threshold power state control circuit 362Q. Based on threshold power states indicated by memory controller circuit 112A and received at threshold power state control circuit 362A and based on the first threshold power state signal received from threshold power state control circuit 362Q, threshold power state control circuit 32A may determine the first threshold power state corresponding to a CPG operation performed at one or more of memory resource circuits 510A-510M.

Generally, disclosed multi-die techniques may advantageously facilitate CPG operations for memory resources that are accessible to clients on multiple dies, with reduced or eliminated negative performance impacts for those clients. In embodiments in which there are restrictions on which clients on which dies are allowed or configured to access memory resources of other dies, a given power management circuit 114 may consider operating parameters (or keep alive levels) for only a relevant subset of clients configured or allowed to access a particular memory resource for which CPG actions are being limited.

FIG. 6 is a flow diagram illustrating example operations to implement adjustable CPG control, according to some embodiments. The method shown in FIG. 6 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At block 610, a computing device (e.g., power management circuit 114) receives operating parameters associated with the plurality of client circuits. In some embodiments, threshold power state mapping circuit 202, which may be a component of power management circuit 114, receives one or more operating parameters from client circuits 118-120. Additionally, in some embodiments, the operating parameters (e.g., the one or more operating parameters) include an outstanding memory resource circuit transaction indicator that indicates whether a given client circuit (e.g., client circuit 118, 120) of the plurality of client circuits has generated a request to the memory resource circuit (e.g., memory resource circuit 102) that is not complete. Further, in some embodiments, the outstanding memory resource circuit transaction indicator indicates a count of requests to the memory resource circuit that have been generated by the given client circuit and are not complete.

Moreover, in some embodiments, the operating parameters include a workload indicator that indicates a workload category of a workload processed by a given client circuit (e.g., client circuit 118, 120) of the plurality of client circuits. In some embodiments, the workload category is selected from a set of workload categories that includes at least a performance-biased workload category and a power-biased workload category. Further, in some embodiments, the operating parameters include a floor enable indicator that indicates a request to maintain the memory circuit at a particular threshold power state.

At block 620, the computing device determines, based on the operating parameters, a threshold power state for the memory resource circuit. In some embodiments, threshold power state mapping circuit 202 determines, based on the operating parameters, a threshold power state at which to operate memory resource circuit 102. Additionally, in some embodiments, the threshold power state corresponds to one of multiple power states at which the power management circuit (e.g., power management circuit 114) is configured to operate the memory resource circuit. In some embodiments, the multiple power states include at least: a first power state in which the memory resource circuit is in an active power state; a second power state in which the memory resource circuit is clock gated; a third power state in which the memory resource circuit is power gated; and a fourth power state in which the memory resource circuit is both clock gated and power gated. Other examples may include a fifth power state corresponding to a teardown disable indicator configured to inhibit link teardown.

At block 630, a computing device (e.g., power management circuit 114) initiates a clock gating operation, a power gating operation, or both for the memory resource circuit. In some embodiments, threshold power state control circuit 362, which may be a component of power management circuit 114, initiates a clock gating operation, a power gating operation, or both for memory resource circuit 102. In some embodiments, the power management circuit is further configured to determine a first client threshold power state for a first client circuit (e.g., client circuit 118 or 120) of the plurality of client circuits based on a first set of operating parameters of the first client circuit. Additionally, in some embodiments, the power management circuit is further configured to determine a second client threshold power state for a second client circuit (e.g., the other of client circuit 118 or 120) of the plurality of client circuits based on a second set of operating parameters of the second client circuit. Moreover, in some embodiments, the power management circuit is further configured to determine the threshold power state for the memory circuit as a most active power state from at least the first client threshold power state and the second client threshold power state. In some embodiments, the power management circuit is configured to map the first set of operating parameters of the first client circuit to the first client threshold power state based on one or more configurable registers.

At block 640, the computing device maintains at least the threshold power state for the memory circuit by limiting a clock gating operation, a power gating operation, or both for the memory resource circuit. In some embodiments, threshold power state control circuit 362 maintains at least the threshold power state for memory resource circuit 102 by limiting a clock gating operation, a power gating operation, or both for memory resource circuit 102.

In some embodiments, the computing device (e.g., power management circuit 114) is configured to determine the threshold power state based on one or more software-indicated threshold power state requests. For example, the one or more software-indicated threshold power state requests may be indicated by workload indication register 304, floor enable register 306, or both.

In some embodiments, the computing device includes fabric circuity (e.g., fabric circuits 110, 116). In some embodiments, the computing device (e.g., power management circuit 114) is configured to limit performance of the clock gating operation, the power gating operation, or both for the fabric circuitry based on the operating parameters.

In some embodiments, the memory circuit includes at least one of: cache circuitry; fabric circuitry; and dynamic random access memory channel control circuitry. In some embodiments, the power management circuit is further configured to, based on the operating parameters, disable teardown of a link configured for a client circuit on the fabric circuitry. Additionally, in some embodiments, the computing device includes a phase-locked loop configured to generate a clock signal for one or more client circuits of the plurality of client circuits. Further, in some embodiments, the power management circuit is further configured to control a power level of the phase-locked loop based on the operating parameters.

In some embodiments, the power management circuit is further configured to, based on the operating parameters: determine whether to wake one or more other memory channel control circuits from clock gating, power gating, or both in response to an incoming request to a first memory channel control circuit.

In some embodiments, the memory controller circuit and the power management circuit are implemented on one or more copackaged integrated circuit dies. For example, such copackaged integrated circuit dies are depicted in FIG. 5 as dies 502, 504. In some embodiments, the power management circuit is further configured to, based on the operating parameters, determine whether to initiate a memory self-refresh interval.

In some embodiments, the power management circuit is further configured to receive a second threshold power state signal from a second power management circuit that is configured to determine a second threshold power state based on operating parameters associated with a different plurality of client circuits. For example, and referring to FIG. 5, power management circuit 114A is configured to receive a second threshold power state signal from power management circuit 114Q that is configured to determine a second threshold power state based on operating parameters associated with client circuits 522A-522N. Additionally, in some embodiments, the power management circuit is further configured to determine the threshold power state based on the second threshold power state. For example, power management circuit 114A is configured to determine the threshold power state based on the second threshold power state received from power management circuit 114Q. In some embodiments, the second power management circuit and the different plurality of client circuits are included on a first substrate distinct from a second substrate on which the power management circuit and the memory controller circuit are included. For example, client circuits 522A-522N are included on a substrate distinct from a substrate on which power management circuit 114A and memory controller 112A are included.

Figure 7:
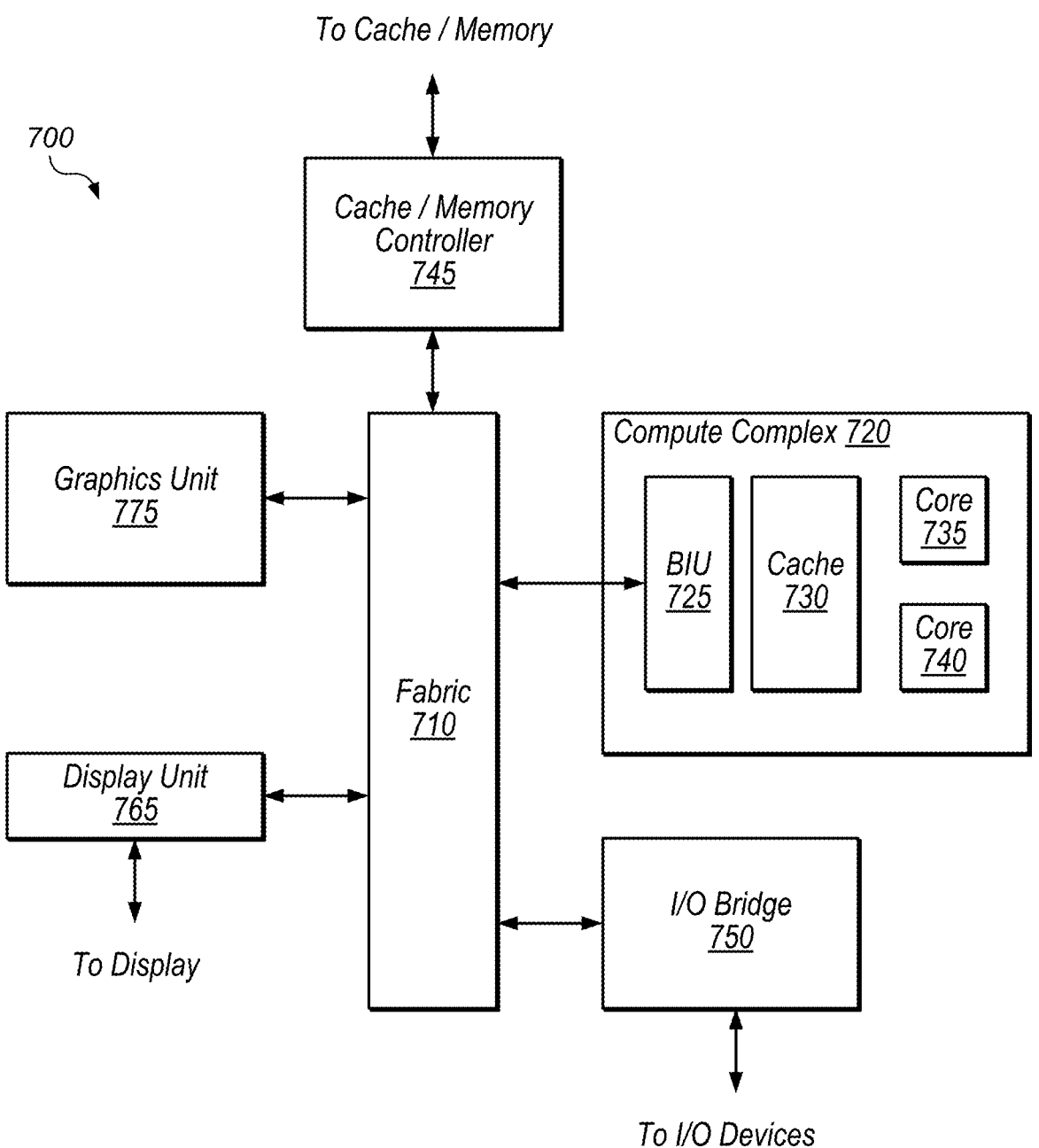
FIG. 7 is a block diagram illustrating an example computing device, according to some embodiments.

FIG. 7 is a block diagram illustrating an example device 700, according to some embodiments. In some embodiments, elements of device 700 may be included within a system on a chip. In some embodiments, device 700 may be included in a mobile device, which may be battery-powered. Therefore, power consumption by device 700 may be an important design consideration. In the illustrated embodiment, device 700 includes fabric 710, compute complex 720, input/output (I/O) bridge 750, cache/memory controller 745, graphics unit 775, and display unit 765. In some embodiments, device 700 may include other components (not shown) in addition to or in place of the illustrated components, such as video processor encoders and decoders, image processing or recognition elements, computer vision elements, etc.

Fabric 710 may include various interconnects, buses, MUX's, controllers, etc., and may be configured to facilitate communication between various elements of device 700. In some embodiments, portions of fabric 710 may be configured to implement various different communication protocols. In other embodiments, fabric 710 may implement a single communication protocol and elements coupled to fabric 710 may convert from the single communication protocol to other communication protocols internally.

In the illustrated embodiment, compute complex 720 includes bus interface unit (BIU) 725, cache 730, and cores 735 and 740. In various embodiments, compute complex 720 may include various numbers of processors, processor cores and caches. For example, compute complex 720 may include 1, 2, or 4 processor cores, or any other suitable number. In one embodiment, cache 730 is a set associative L2 cache. In some embodiments, cores 735 and 740 may include internal instruction and data caches. In some embodiments, a coherency unit (not shown) in fabric 710, cache 730, or elsewhere in device 700 may be configured to maintain coherency between various caches of device 700. BIU 725 may be configured to manage communication between compute complex 720 and other elements of device 700. Processor cores such as cores 735 and 740 may be configured to execute instructions of a particular instruction set architecture (ISA) which may include operating system instructions and user application instructions. These instructions may be stored in computer readable medium such as a memory coupled to memory controller 745 discussed below.

As used herein, the term "coupled to" may indicate one or more connections between elements, and a coupling may include intervening elements. For example, in FIG. 7, graphics unit 775 may be described as "coupled to" a memory through fabric 710 and cache/memory controller 745. In contrast, in the illustrated embodiment of FIG. 7, graphics unit 775 is "directly coupled" to fabric 710 because there are no intervening elements.

Cache/memory controller 745 may be configured to manage transfer of data between fabric 710 and one or more caches and memories. For example, cache/memory controller 745 may be coupled to an L3 cache, which may in turn be coupled to a system memory. In other embodiments, cache/memory controller 745 may be directly coupled to a memory. In some embodiments, cache/memory controller 745 may include one or more internal caches. Memory coupled to controller 745 may be any type of volatile memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to controller 745 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 720 to cause the computing device to perform functionality described herein.

Graphics unit 775 may include one or more processors, e.g., one or more graphics processing units (GPUs). Graphics unit 775 may receive graphics-oriented instructions, such as OPENGL®, Metal®, or DIRECT3D® instructions, for example. Graphics unit 775 may execute specialized GPU instructions or perform other operations based on the received graphics-oriented instructions. Graphics unit 775 may generally be configured to process large blocks of data in parallel and may build images in a frame buffer for output to a display, which may be included in the device or may be a separate device. Graphics unit 775 may include transform, lighting, triangle, and rendering engines in one or more graphics processing pipelines. Graphics unit 775 may output pixel information for display images. Graphics unit 775, in various embodiments, may include programmable shader circuitry which may include highly parallel execution cores configured to execute graphics programs, which may include pixel tasks, vertex tasks, and compute tasks (which may or may not be graphics-related).

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display).

I/O bridge 750 may include various elements configured to implement: universal serial bus (USB) communications, security, audio, and low-power always-on functionality, for example. I/O bridge 750 may also include interfaces such as pulse-width modulation (PWM), general-purpose input/output (GPIO), serial peripheral interface (SPI), and inter-integrated circuit (I2C), for example. Various types of peripherals and devices may be coupled to device 700 via I/O bridge 750.

In some embodiments, device 700 includes network interface circuitry (not explicitly shown), which may be connected to fabric 710 or I/O bridge 750. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 700 with connectivity to various types of other devices and networks.

Figure 8:
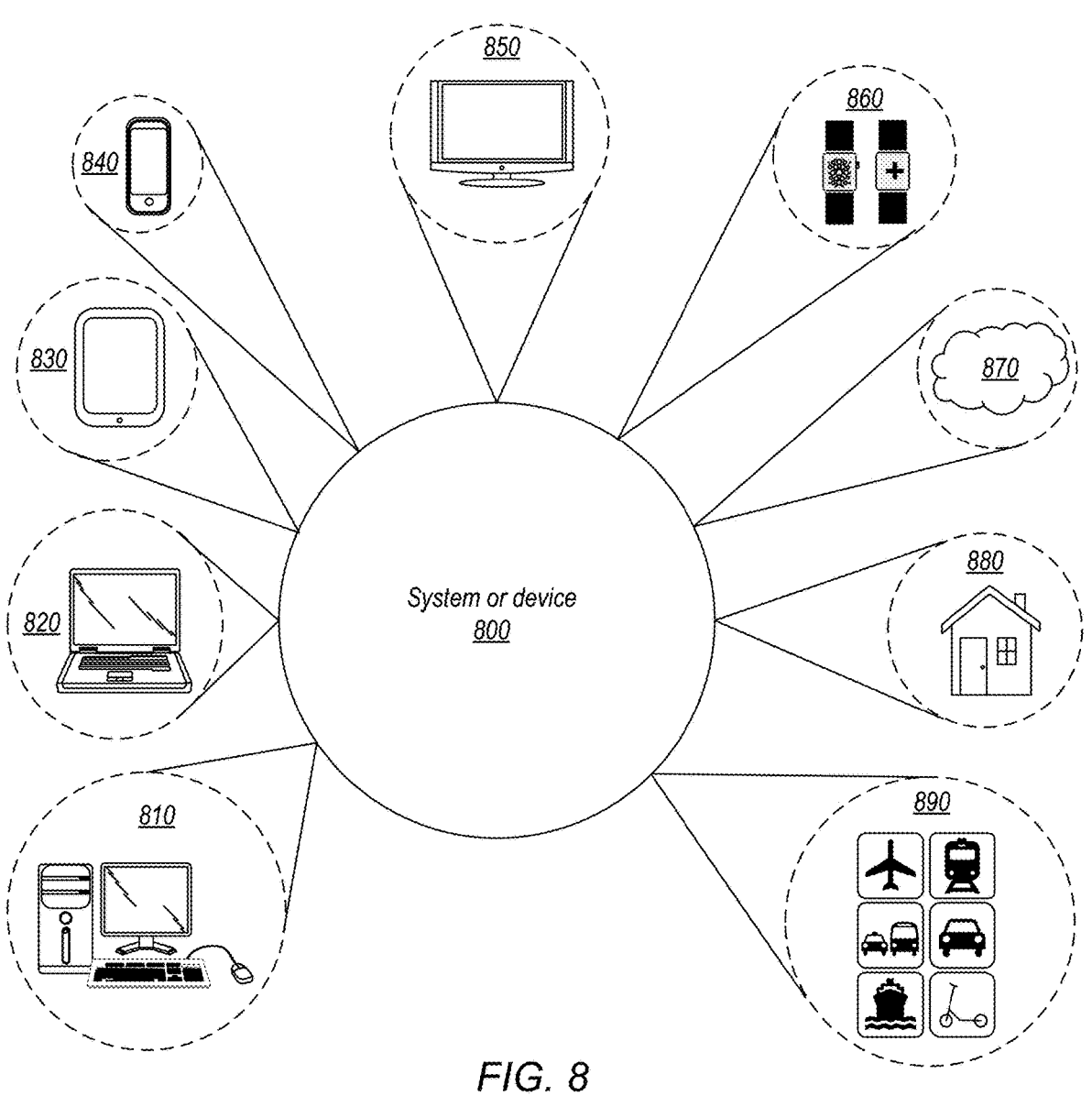
FIG. 8 is a diagram illustrating example applications of disclosed systems and devices, according to some embodiments.

FIG. 8 is a diagram illustrating example applications of disclosed systems and devices, according to some embodiments. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as: design simulation, design synthesis, circuit fabrication, etc.

Figure 9:
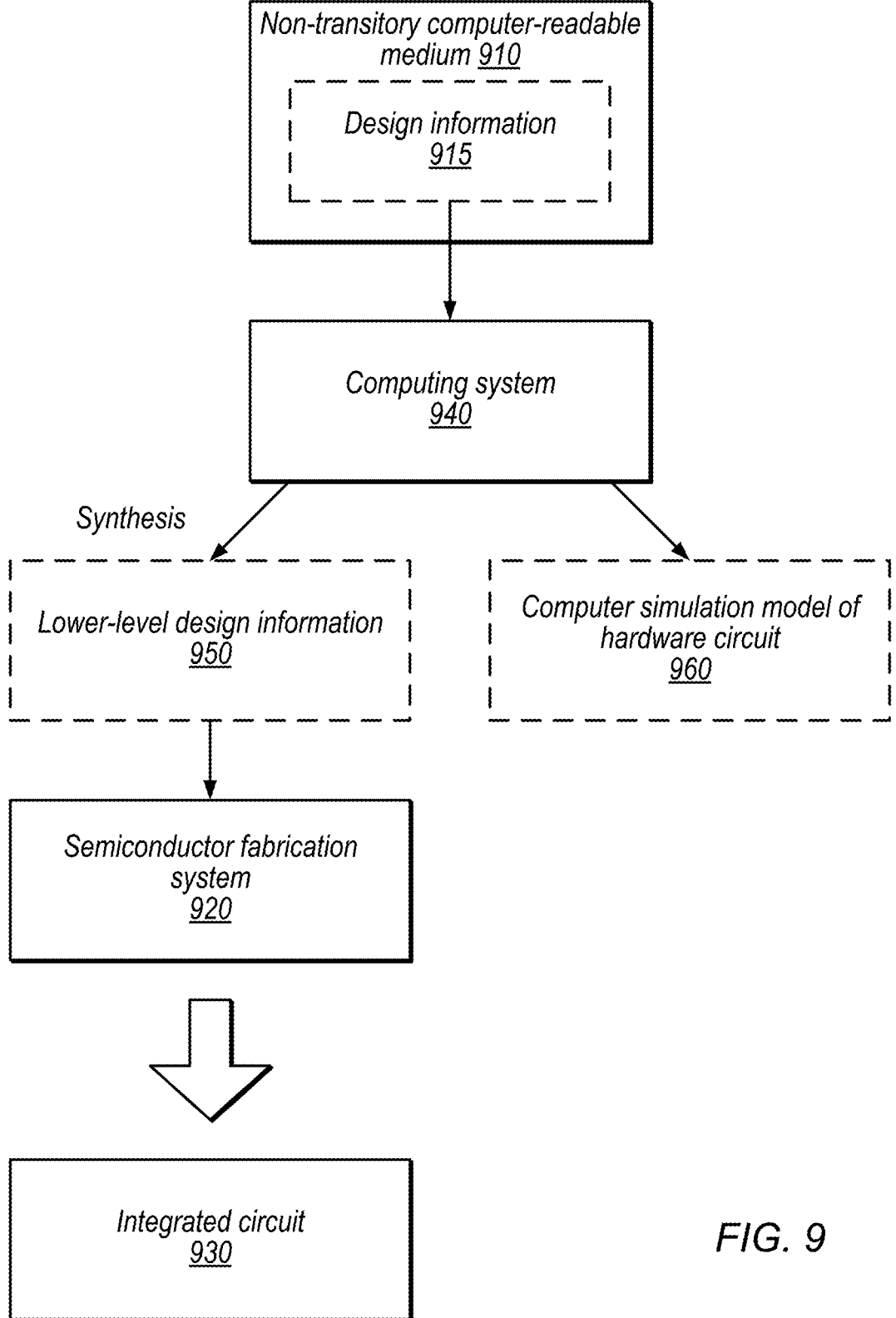
FIG. 9 is a block diagram illustrating an example computer-readable medium that stores circuit design information, according to some embodiments.

FIG. 9 is a block diagram illustrating an example non-transitory computer-readable storage medium that stores circuit design information, according to some embodiments. In the illustrated embodiment, computing system 940 is configured to process the design information. This may include executing instructions included in the design information, interpreting instructions included in the design information, compiling, transforming, or otherwise updating the design information, etc. Therefore, the design information controls computing system 940 (e.g., by programming computing system 940) to perform various operations discussed below, in some embodiments.

In the illustrated example, computing system 940 processes the design information to generate both a computer simulation model of a hardware circuit (hereinafter referred to as the "model") 960 and lower-level design information

950. In other embodiments, computing system 940 may generate only one of these outputs, may generate other outputs based on the design information, or both. Regarding the computing simulation, computing system 940 may execute instructions of a hardware description language that includes register transfer level (RTL) code, behavioral code, structural code, or some combination thereof. The simulation model may perform the functionality specified by the design information, facilitate verification of the functional correctness of the hardware design, generate power consumption estimates, generate timing estimates, etc.

In the illustrated example, computing system 940 also processes the design information to generate lower-level design information 950 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on lower-level design information 950 (potentially among other inputs), semiconductor fabrication system 920 is configured to fabricate an integrated circuit 930 (which may correspond to functionality of the simulation model 960). Note that computing system 940 may generate different simulation models based on design information at various levels of description, including information 950, 915, and so on. The data representing design information 950 and model 960 may be stored on medium 910 or on one or more other media.

In some embodiments, the lower-level design information 950 controls (e.g., programs) the semiconductor fabrication system 920 to fabricate the integrated circuit 930. Thus, when processed by the fabrication system, the design information may program the fabrication system to fabricate a circuit that includes various circuitry disclosed herein.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Accordingly, non-transitory computer-readable storage medium 910 may include two or more memory media; such media may reside in different locations—for example, in different computer systems that are connected over a network.

Design information 915 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 940, semiconductor fabrication system 920, or both. In some embodiments, design information may also include one or more cell libraries that specify the synthesis, layout, or both of integrated circuit 930. In some embodiments, the design information is specified in whole or in part in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 930 may, in various embodiments, include one or more custom macrocells, such as memories, analog or mixed-signal circuits, and the like. In such cases, design information may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 and model 960 are configured to operate according to a circuit design specified by design information 915, which may include performing any of the functionality described herein. For example, integrated circuit 930 may include any of various elements shown in FIGS. 1-5 and 7. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model" does not imply that the instructions must be executed in order for the element to be met, but rather specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by the design information. The different circuit implementations may affect the performance, area, power consumption, etc. of a given design (potentially with tradeoffs between different design goals), but the logical function does not vary among the different circuit implementations of the same circuit design.

In some embodiments, the instructions included in the design information instructions provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information. The lower-level design information may program semiconductor fabrication system 920 to fabricate integrated circuit 930.

The various techniques described herein may be performed by one or more computer programs. The term "program" is to be construed broadly to cover a sequence of instructions in a programming language that a computing device can execute. These programs may be written in any suitable computer language, including lower-level languages such as assembly and higher-level languages such as Python. The program may be written in a compiled language such as C or C++, or an interpreted language such as JavaScript.

Program instructions may be stored on a "computer-readable storage medium" or a "computer-readable medium" in order to facilitate execution of the program instructions by a computer system. Generally speaking, these phrases include any tangible or non-transitory storage or memory medium. The terms "tangible" and "non-transitory" are intended to exclude propagating electromagnetic signals, but not to otherwise limit the type of storage medium. Accordingly, the phrases "computer-readable storage medium" or a "computer-readable medium" are intended to cover types of storage devices that do not necessarily store information permanently (e.g., random access memory (RAM)). The term "non-transitory," accordingly, is a limitation on the nature of the medium itself (i.e., the medium cannot be a signal) as opposed to a limitation on data storage persistency of the medium (e.g., RAM vs. ROM).

The phrases "computer-readable storage medium" and "computer-readable medium" are intended to refer to both a storage medium within a computer system as well as a removable medium such as a CD-ROM, memory stick, or portable hard drive. The phrases cover any type of volatile memory within a computer system including DRAM, DDR RAM, SRAM, EDO RAM, Rambus RAM, etc., as well as non-volatile memory such as magnetic media, e.g., a hard drive, or optical storage. The phrases are explicitly intended to cover the memory of a server that facilitates downloading of program instructions, the memories within any intermediate computer system involved in the download, as well as the memories of all destination computing devices. Still further, the phrases are intended to cover combinations of different types of memories.

In addition, a computer-readable medium or storage medium may be located in a first set of one or more computer systems in which the programs are executed, as well as in a second set of one or more computer systems which connect to the first set over a network. In the latter instance, the second set of computer systems may provide program instructions to the first set of computer systems for execution. In short, the phrases "computer-readable storage medium" and "computer-readable medium" may include two or more media that may reside in different locations, e.g., in different computers that are connected over a network.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. An apparatus, comprising:
a memory controller circuit coupled to a memory resource circuit and coupled to a plurality of heterogeneous client circuits configured to access the memory resource circuit via the memory controller circuit; and
a power management circuit coupled to the memory controller circuit, wherein the power management circuit is configured to:
receive operating parameters associated with the plurality of client circuits,
determine, based on the operating parameters, a threshold power state for the memory resource circuit,
initiate a clock gating operation, a power gating operation, or both for the memory resource circuit; and
maintain at least the threshold power state for the memory resource circuit, wherein, to maintain the at least the threshold power state, the power management circuit is configured to limit performance of the clock gating operation, the power gating operation, or both for the memory resource circuit.

2. The apparatus of claim 1, wherein the operating parameters include an outstanding memory resource circuit transaction indicator that indicates whether a given client circuit of the plurality of client circuits has generated a request to the memory resource circuit that is not complete.

3. The apparatus of claim 2, wherein the outstanding memory resource circuit transaction indicator indicates a count of requests to the memory resource circuit that have been generated by the given client circuit and are not complete.

4. The apparatus of claim 1, wherein the operating parameters include a workload indicator that indicates a workload category of a workload processed by a given client circuit of the plurality of client circuits, wherein the workload category is selected from a set of workload categories that includes at least a performance-biased workload category and a power-biased workload category.

5. The apparatus of claim 1, wherein the operating parameters include a floor enable indicator that indicates a request to maintain the memory resource circuit at a particular threshold power state.

6. The apparatus of claim 1, wherein:
the threshold power state corresponds to one of multiple power states at which the power management circuit is configured to operate the memory resource circuit; and
the multiple power states include at least:
a first power state in which the memory resource circuit is in an active power state;
a second power state in which the memory resource circuit is clock gated;
a third power state in which the memory resource circuit is power gated; and
a fourth power state in which the memory resource circuit is both clock gated and power gated.

7. The apparatus of claim 1, wherein the power management circuit is further configured to:
determine a first client threshold power state for a first client circuit of the plurality of client circuits based on a first set of operating parameters of the first client circuit;
determine a second client threshold power state for a second client circuit of the plurality of client circuits based on a second set of operating parameters of the second client circuit; and
determine the threshold power state for the memory resource circuit as a most active power state from at least the first client threshold power state and the second client threshold power state.

8. The apparatus of claim 7, wherein:
the power management circuit is configured to map the first set of operating parameters of the first client circuit to the first client threshold power state based on one or more configurable registers.

9. The apparatus of claim 1, wherein the power management circuit is configured to determine the threshold power state based on one or more software-indicated threshold power state requests.

10. The apparatus of claim 1, further comprising:
fabric circuitry;
wherein the power management circuit is further configured to:
limit performance of the clock gating operation, the power gating operation, or both for the fabric circuitry based on the operating parameters.

11. The apparatus of claim 10, wherein the power management circuit is further configured to, based on the operating parameters, disable teardown of a link configured for a client circuit on the fabric circuitry.

12. The apparatus of claim 1, further comprising:
a phase-locked loop configured to generate a clock signal for one or more client circuits of the plurality of client circuits;
wherein the power management circuit is further configured to:

control a power level of the phase-locked loop based on the operating parameters.

13. The apparatus of claim 1, wherein, based on the operating parameters, the power management circuit is further configured to:

determine whether to wake one or more other memory channel control circuits from clock gating, power gating, or both in response to an incoming request to a first memory channel control circuit.

14. The apparatus of claim 1, further comprising the memory resource circuit, wherein the memory controller circuit and the power management circuit are implemented on one or more copackaged integrated circuit dies.

15. The apparatus of claim 1, wherein the power management circuit is further configured to, based on the operating parameters, determine whether to initiate a memory self-refresh interval.

16. The apparatus of claim 1, wherein the power management circuit is further configured to:

receive a second threshold power state signal from a second power management circuit that is configured to determine a second threshold power state based on operating parameters associated with a different plurality of client circuits; and determine the threshold power state based on the second threshold power state.

17. The apparatus of claim 16, wherein the second power management circuit and the different plurality of client circuits are included on a first substrate distinct from a second substrate on which the power management circuit and the memory controller circuit are included.

18. A method, comprising:

receiving, by a computing device, operating parameters associated with a plurality of heterogeneous client circuits, wherein the plurality of heterogeneous client circuits is configured to access a memory resource circuit via a memory controller circuit, the memory controller circuit coupled to the memory resource circuit and coupled to the plurality of client circuits;

determining, by the computing device and based on the operating parameters, a threshold power state for the memory resource circuit;

initiating, by the computing device, a clock gating operation, a power gating operation, or both for the memory resource circuit; and maintaining, by the computing device, at least the threshold power state for the memory resource circuit, wherein maintaining the at least the threshold power state includes limiting performance of the clock gating operation, the power gating operation, or both for the memory resource circuit.

19. The method of claim 18, wherein the operating parameters include:

an outstanding memory resource circuit transaction indicator that indicates whether a given client circuit of the plurality of client circuits has generated a request to the memory resource circuit that is not complete;

a workload indicator that indicates a workload category of a workload processed by a given client circuit of the plurality of client circuits, wherein the workload category is selected from a set of workload categories that includes at least a performance-biased workload category and a power-biased workload category; and a floor enable indicator that indicates a request to maintain the memory resource circuit at a particular threshold power state.

20. A system, comprising:

a memory resource circuit;

a memory controller circuit coupled to the memory circuit and coupled to a plurality of heterogeneous client circuits; and a power management circuit coupled to the memory controller circuit, wherein the power management circuit is configured to:

receive operating parameters associated with the plurality of client circuits, determine, based on the operating parameters, a threshold power state for the memory resource circuit, and initiate a clock gating operation, a power gating operation, or both for the memory resource circuit, including to maintain at least the threshold power state for the memory resource circuit.

* * * * *